United States Patent
Yoshida et al.

(10) Patent No.: US 7,741,684 B2
(45) Date of Patent: Jun. 22, 2010

(54) SEMICONDUCTOR DEVICE AND METHOD FOR FABRICATING THE SAME

(75) Inventors: Chikako Yoshida, Kawasaki (JP);
Hiroshi Minakata, Kawasaki (JP);
Masaomi Yamaguchi, Kawasaki (JP);
Shinji Miyagaki, Kawasaki (JP);
Yasuyuki Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 841 days.

(21) Appl. No.: 11/183,756

(22) Filed: Jul. 19, 2005

(65) Prior Publication Data

US 2005/0247988 A1 Nov. 10, 2005

(51) Int. Cl.
*H01L 27/088* (2006.01)
*H01L 29/78* (2006.01)

(52) U.S. Cl. ............... 257/411; 257/412; 257/E21.625

(58) Field of Classification Search ........... 257/616, 257/295, 410–413, 778, 258, E21.625
See application file for complete search history.

(56) References Cited

U.S. PATENT DOCUMENTS

| | | | |
|---|---|---|---|
| 6,060,755 A | 5/2000 | Ma et al. | |
| 6,441,417 B1 * | 8/2002 | Zhang et al. | 257/295 |
| 6,451,641 B1 | 9/2002 | Halliyal et al. | |
| 6,617,209 B1 | 9/2003 | Chau et al. | |
| 6,734,527 B1 * | 5/2004 | Xiang | 257/616 |
| 2003/0211692 A1 * | 11/2003 | Lee | 438/258 |
| 2006/0003599 A1 * | 1/2006 | Yamamoto | 438/778 |

FOREIGN PATENT DOCUMENTS

| | | | |
|---|---|---|---|
| JP | 07153666 A | 6/1995 | |
| JP | 08115923 A | 5/1996 | |
| JP | 10073927 | 3/1998 | |
| JP | 11307549 A | 11/1999 | |
| JP | 2001-77111 A | 3/2001 | |

(Continued)

OTHER PUBLICATIONS

D.C. Gilmer et al., "Compatibility of Polycrystalline Silicon Gate Deposition with HfO₂ and Al₂O₃/HfO₂ Gate Dielectrics", Appl. Phys. Lett., vol. 81, No. 7, pp. 1288-1290 , 2002.
M.-Y. Ho et al., "Suppressed Crystallization of Hf-based Gate Dielectrics by Controlled Addition of Al2O3 Using Atomic Layer Deposition," App. Phys. Lett., pp. 4218-4220, vol. 81, No. 22, 2002.
Japanese Office Action mailed Nov. 10, 2009, issued in corresponding Japanese Application No. 2005-364379.

*Primary Examiner*—Leonardo Andújar
*Assistant Examiner*—Monica D Harrison
(74) *Attorney, Agent, or Firm*—Westerman, Hattori, Daniels & Adrian, LLP

(57) ABSTRACT

The semiconductor device comprises a gate insulating film including a first dielectric film of $Hf_xAl_{1-x}O_y$ (0.7<x<1) formed over a semiconductor substrate, and a second dielectric film different from the first dielectric film formed over the first dielectric film; and a gate electrode formed over the gate insulating film and including a polycrystalline silicon film, whereby the local abnormal growth of the polycrystalline silicon film in the process of forming the polycrystalline silicon film is prevented, and the gate leakage current can be much decreased.

4 Claims, 13 Drawing Sheets

FOREIGN PATENT DOCUMENTS

| | | |
|---|---|---|
| JP | 2002-033320 A | 1/2002 |
| JP | 2003008004 | 1/2003 |
| JP | 2004214366 | 7/2004 |
| JP | 2001-267566 A | 9/2005 |
| WO | 02/065525 A1 | 8/2002 |
| WO | WO 02/065525 A1 | 8/2002 |

* cited by examiner

0    [nA]    1.0 x=0.6 x=0.7 x=0.8 x=0.9 x=1.0

1 μm

1 μm

SEMICONDUCTOR DEVICE AND METHOD FOR FABRICATING THE SAME

CROSS-REFERENCE TO RELATED APPLICATIONS

This application is based upon and claims the benefit of priority from the prior Japanese Patent Application No. 2003-029372, filed on Feb. 6, 2003, the entire contents of which are incorporated herein by reference.

BACKGROUND OF THE INVENTION

The present invention relates to a semiconductor device and a method for fabricating the semiconductor device, more specifically to a semiconductor device including an MIS (Metal-Insulator-Semiconductor) transistor having a gate insulating film of a high dielectric constant film, and a method for fabricating the semiconductor device.

As MIS transistors are increasingly downsized due to higher integration of semiconductor devices, the gate insulating films are made increasingly thinner. Transistors for gate lengths of below 50 nm are expected several years later. Gate insulating films of film thicknesses of below 1 nm in terms of the thickness of the silicon oxide film are required.

As the gate insulating films, conventionally silicon oxide-based insulating films have been dominantly used. However, there has been noted a problem that when the silicon oxide-based insulating films have thicknesses of below about 3 nm, the tunneling leakage current is conspicuous, and the silicon oxide-based insulating films fail to function as the insulating film. Studies are being made of forming the gate insulating films of new materials taking the place of the silicon oxide-based insulating films, whose thicknesses are below 1 nm in terms of the thickness of the silicon oxide-based insulating films.

It is being studied to use materials whose dielectric constants are higher than the dielectric constant of silicon oxide (high-k materials) as a gate insulating film in place of the silicon oxide-based insulating films. The use of the high-k materials permits the physical film thickness of the gate insulating film to be thick, whereby the leakage current can be suppressed.

As the high-k materials, various metal oxide materials are proposed; $ZrO_2$, $Al_2O_3$, $HfO_2$, $TaO_2$, etc. are noted. Among them, $HfO_2$ is prospective because of advantages that the relative dielectric constant is about 20~30, which is high; $HfO_2$ is not easily silicidized more than $ZrO_2$; that the interfacial layer thereof with respect to a silicon substrate does not much increase while being grown; etc.

However, as-grown $HfO_2$ is partially crystallized and disadvantageously has large leakage current. It is known that when polycrystalline silicon film is grown on $HfO_2$, the polycrystalline silicon locally abnormally grows.

As for the problem of the crystallization of $HfO_2$, it is proposed to mix a non-crystalline material in the gate insulating film as described in, e.g., Reference 1 (Japanese published unexamined patent application No. 2001-267566). As described in Reference 2 (Japanese published unexamined patent application No. 2002-033320), it is proposed to mix $SiO_2$, $Al_2O_3$ or others, which are not easily crystallized into $HfO_2$ to thereby suppress the crystallization so as to suppress the leakage current. As for the abnormal growth of the polycrystalline silicon, Reference 3 (D. C. Gilmer et al., "Compatibility of polycrystalline silicon gate deposition with $HfO_2$ and $Al_2O_3/HfO_2$ gate dielectrics", Appl. Phys. Lett. Vol. 81, pp. 1288-1290 (2002)) discloses that an $AlO_3$ film is formed between an $HfO_2$ film and a polycrystalline silicon film to thereby suppress the abnormal growth of the polycrystalline silicon.

SUMMARY OF THE INVENTION

The result of the earnest studies of the high-k films of $HfO_2$—$Al_2O_3$ mixed system (hereinafter called $Hf_xAl_{1-x}O_y$) the inventors of the present application have made shows that when $Al_2O_3$, etc. are mixed in $HfO_2$ to thereby suppress the crystallization of the $HfO_2$, the gate leakage current is often increased in Hf-rich regions. It has been found that the polycrystalline silicon gate is abnormally grown to produce island-shaped projections in the Hf-rich regions.

An object of the present invention is to provide a semiconductor device including MIS transistors having a gate insulating film containing $Hf_xAl_{1-x}O_y$, which can suppress the gate leakage current and the production of island-shaped projections, and a method for fabricating the semiconductor device.

According to one aspect of the present invention, there is provided a semiconductor device comprising: a gate insulating film including a first dielectric film of $Hf_xAl_{1-x}O_y$ in which x is 0.7<x<1, formed over a semiconductor substrate, and a second dielectric film different from the first dielectric film formed over the first dielectric film; and a gate electrode formed on the gate insulating film and including a polycrystalline silicon film.

According to another aspect of the present invention, there is provided a semiconductor device comprising: a gate insulating film formed on a semiconductor substrate and including an $Hf_xAl_{1-x}O_y$ film having a thickness below 1 nm in which x is 0.7<x<1; and a gate electrode formed on the gate insulating film and including a polycrystalline silicon film.

According to further another aspect of the present invention, there is provided a method for fabricating a semiconductor device comprising the steps of: forming over a semiconductor substrate a first dielectric film of $Hf_xAl_{1-x}O_y$ in which x is 0.7<x<1; forming a second dielectric film different from the first dielectric film over the first dielectric film; and forming a polycrystalline silicon film over the second dielectric film.

According to further another aspect of the present invention, there is provided a method for fabricating a semiconductor device comprising the steps of: forming a first dielectric film of a silicon-based insulating film over a semiconductor substrate; forming over the first dielectric film a second dielectric film of $Hf_xAl_{1-x}O_y$ having a thickness below 1 nm in which x is 0.7<x<1; and forming a polycrystalline silicon film over the second dielectric film.

According to further another aspect of the present invention, there is provided a method for fabricating a semiconductor device comprising the steps of: forming a dielectric film of $Hf_xAl_{1-x}O_y$ over a semiconductor substrate; and forming over the dielectric film a silicon film at a temperature of below 550° C.

According to the present invention, between an $Hf_xAl_{1-x}O_y$ film and a silicon film, an insulating film which can suppress the abnormal growth of the silicon film, the thickness of the $Hf_xAl_{1-x}O_y$ film is set to be below 1 nm, or the silicon film is formed in amorphous state on $Hf_xAl_{1-x}O_y$, whereby the local abnormal growth of the silicon film in forming the silicon film on the $Hf_xAl_{1-x}O_y$ can be suppressed. The gate leakage current can be much decreased.

DETAILED DESCRIPTION OF THE INVENTION

Principle According to the Embodiments of the Present Invention

The result of the earnest studies of $Hf_xAl_{1-x}O_y$ the inventors of the present application have made shows that the leakage current through $Hf_xAl_{1-x}O_y$ film is much dependent on the hafnium composition (x). When the hafnium composition x is above 0.9, large leakage current is observed. This will be because the $Hf_xAl_{1-x}O_y$ film even as-deposited state is partially crystallized. When polycrystalline silicon film to form gate electrodes is formed on the $Hf_xAl_{1-x}O_y$ film with an Hf composition x of $0.7<x<1$, the polycrystalline silicon film is locally abnormally grown, and large island-shaped projections are produced. It is not known whether the abnormal growth is related directly to the leakage current, but the produced island-shaped projections affect the semiconductor device fabrication process, and the semiconductor device cannot be fabricated as designed.

Figure 1A:
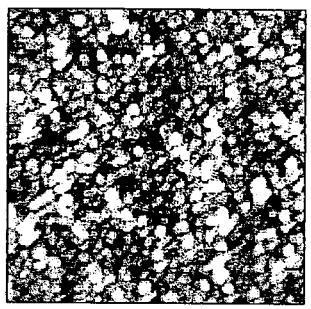
FIGS. 1A, 1C, 1E, and 1G are views showing surface states of the polycrystalline silicon films.
Figure 1B:
FIGS. 1B, 1D, 1F, and 1H are views showing intra-plane leakage currents.
Figure 1C:
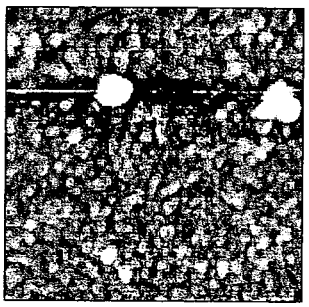
Figure 1D:
Figure 1E:
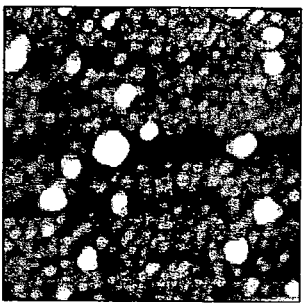
Figure 1F:
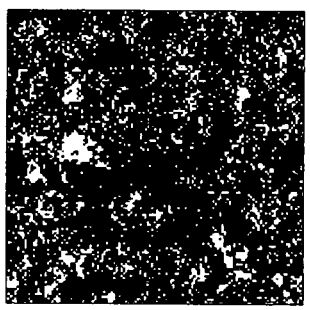
Figure 1G:
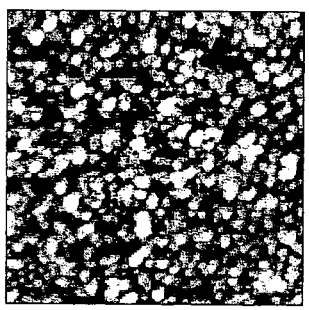
Figure 1H:
Figure 1H:
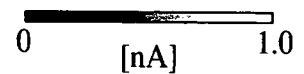

To scrutinize these phenomena, the inventors of the present application investigated local leakage current characteristics of the polycrystalline silicon/$Hf_xAl_{1-x}O_y$ structure with AFM (Atomic Force Microscope). FIGS. 1A-1H show the results. FIG. 1A is a surface topographic image with an Hf composition of x=0.7. FIG. 1B is a view of the intra-plane leakage current observed simultaneously with taking the topographic image of FIG. 1A. FIG. 1C is a surface topographic image with an Hf composition of x=0.8. FIG. 1D is a view of the intra-plane leakage current observed simultaneously with taking the topographic image of FIG. 1C. FIG. 1E is a surface topographic image with an Hf composition of x=0.9. FIG. 1F is a view of the intra-plane leakage current observed simultaneously with taking the topographic image of FIG. 1E. FIG. 1G is a surface topographic image with an Hf composition of x=1.0. FIG. 1H is a view of the intra-plane leakage current observed simultaneously with taking the topographic image of FIG. 1G.

In the topographic images of FIGS. 1C and 1E, a number of island-shaped projections are observed. These island-shaped projections were produced by the abnormal growth of the polycrystalline silicon. On the other hand, with hafnium compositions of x=1.0 and x=0.7, as shown in FIGS. 1A and 1G, no island-shaped projections have been produced. It has been found that the island-shaped projections are not observed at the early stage of the growth of the polycrystalline silicon film but are produced when the polycrystalline silicon film has grown into a sufficient thickness.

On the other hand, as shown in FIGS. 1B, 1D, 1F and 1H, it has been found that more leakage current takes place as the hafnium composition x is larger. The spots of the leakage current do no always agree with the positions of the island-shaped projections. It has been found that with a hafnium composition of x=0.8, leaky spots are locally present. These local leakage current spots take place at a 1-2 spots per 4 µm² ratio, which corresponds to the densities of the island-shaped projections produced.

Figure 2:
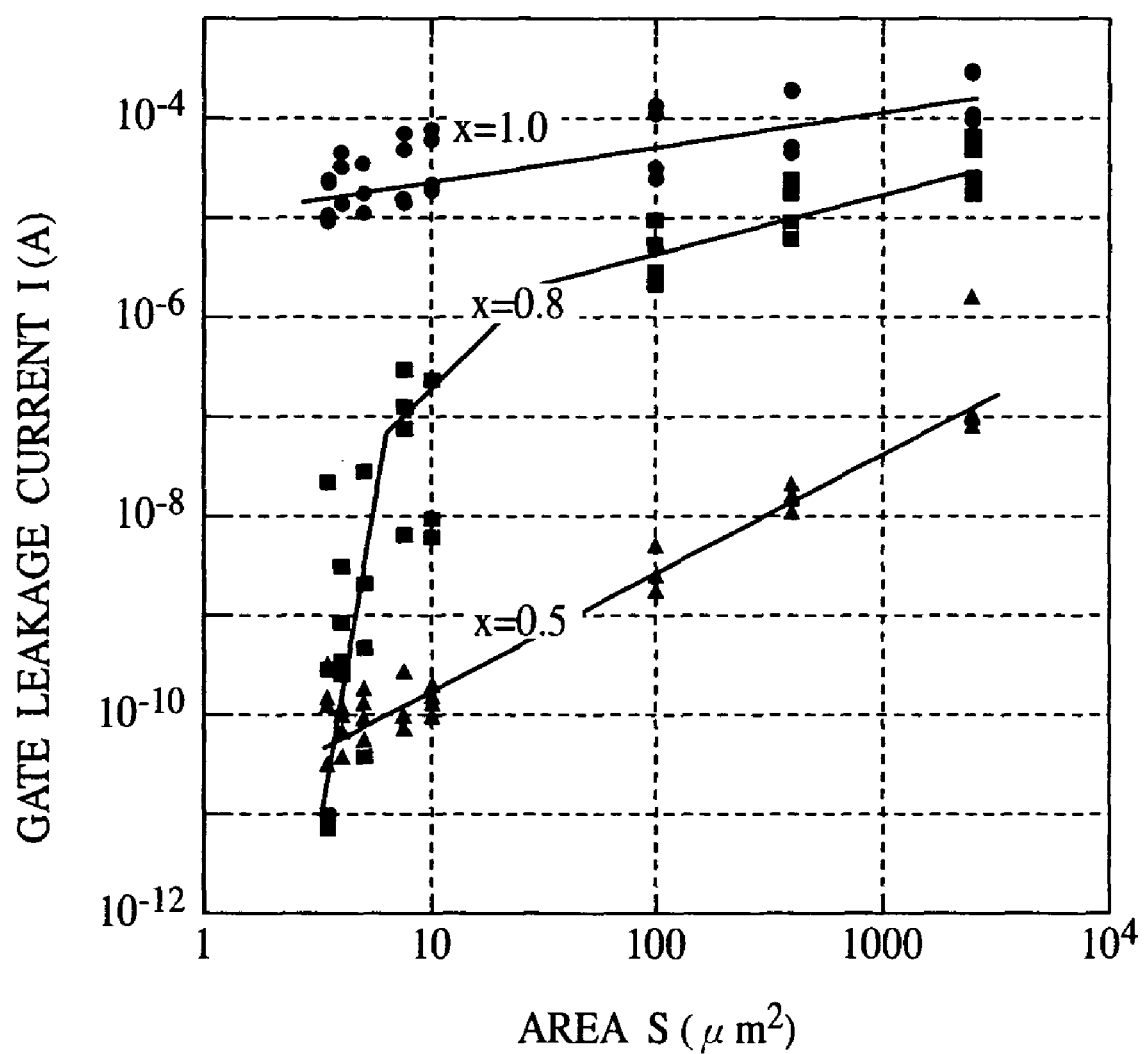
FIG. 2 is a graph showing hafnium composition and gate area dependency of the gate leakage current characteristics.

FIG. 2 is a graph of the hafnium composition and gate area dependency of the gate leakage current of MOS capacitors having the gate insulating films of $Hf_xAl_{1-x}O_y$. As shown in FIG. 2, in the samples having the hafnium compositions of x=0.5 and x=1.0, the variations of the leakage current are not large even as the gate areas are decreased. In the sample having the hafnium composition of x=0.8, the variations of the leakage current are larger as the gate areas are decreased. This phenomena will be that when the gate area is large, a number of local leakage spots contained in the gate area is evened to thereby make the variations small, while when the gate area is small, and local leakage current spots are present in the gate, the leakage current is small when the local leakage current spots are not leaky.

Figure 3A:
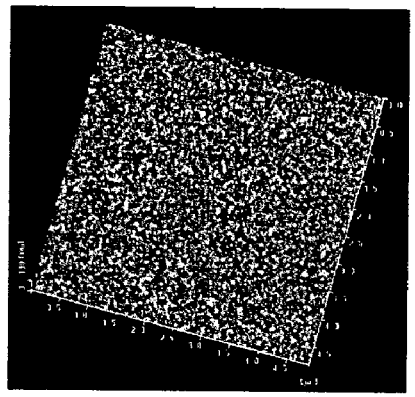
FIGS. 3A-3E are topographic images of surface states of the polycrystalline silicon films, which change with the hafnium composition changed.
Figure 3B:
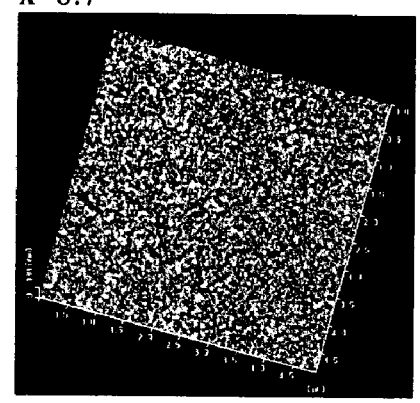
Figure 3C:
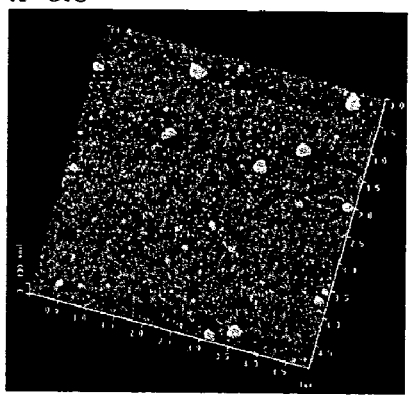
Figure 3D:
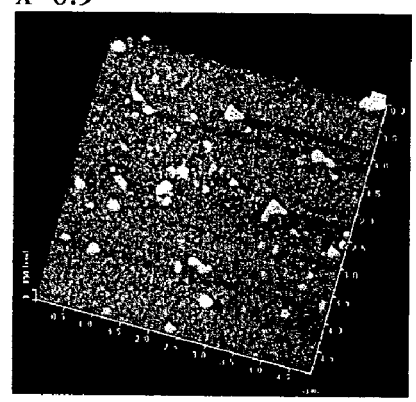
Figure 3E:
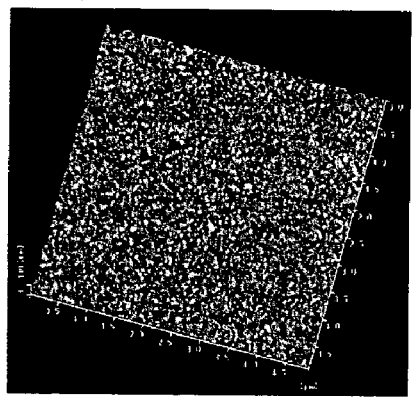

FIGS. 3A-3E are topographic images explaining relationships between the hafnium composition and the abnormal growth of the polycrystalline silicon. In FIG. 3A, the hafnium composition x is 0.6. In FIG. 3B, the hafnium composition x is 0.7. In FIG. 3C, the hafnium composition x is 0.8. In FIG. 3D, the hafnium composition x is 0.9. In FIG. 3E, the hafnium composition x is 1.0.

As shown in FIGS. 3A-3E, when the hafnium composition x is 0.7 or less ($0<x\leq0.7$) and x=1.0, no local abnormal growth of the polycrystalline silicon is observed, but the local abnormal growth of the polycrystalline silicon is grown when the hafnium composition x is 0.8 and 0.9.

Figure 4:
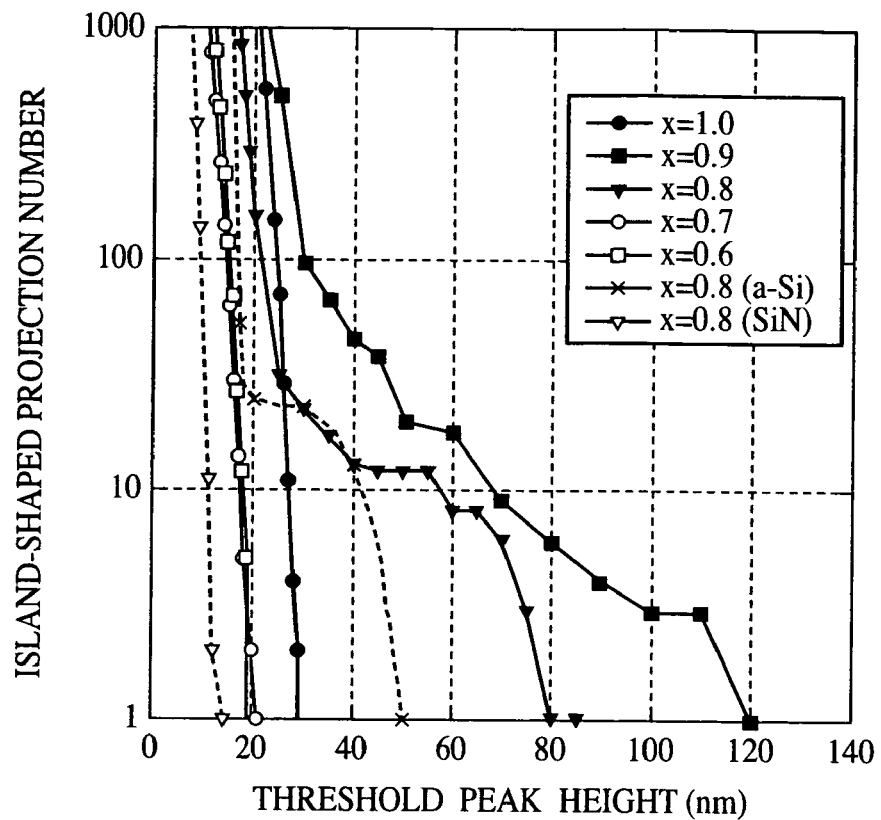
FIG. 4 is a graph showing relationships between the number and the height of island-shaped projections.

FIG. 4 is a graph of relationships between the number and the height of the precipitations. In FIG. 4, the ● marks indicate the case of the hafnium composition x=1.0; the ■ marks indicate the case of the hafnium composition x=0.9; the ▼ marks indicate the case of the hafnium composition x=0.8; the ○ marks indicate the case of the hafnium composition x=0.7; and the □ marks indicate the case of the hafnium composition x=0.6.

As shown, in the cases of the hafnium composition x=0.8 and the hafnium composition x=0.9, the heights of the precipitations are distributed high. The abnormal growth is found.

The hafnium composition x=1.0 corresponds to $HfO_2$ and is the condition for the observed abnormal growth of the polycrystalline silicon in the above-described Reference 3. However, the inventors of the present application have not confirmed the abnormal growth, based on the result of their studies. The result of the studies of the inventors of the present application shows that the abnormal growth takes place more frequently in the case of the hafnium composition x=0.9 than in the case of the hafnium composition x=0.8. Based on this, the abnormal growth of the polycrystalline silicon in the cases of the hafnium compositions x=0.8 and x=0.9 is different from the abnormal growth of the polycrystalline silicon found in the Reference 3 and will be a phenomena based on the specific characteristic of $Hf_xAl_{1-x}O_y$.

As described above, when $Hf_xAl_{1-x}O_y$ has the hafnium composition x of $0.7<x<1$, the abnormal growth of the polycrystalline silicon takes place. Accordingly, to prevent the abnormal growth of the polycrystalline silicon, the hafnium composition x is set to be below 0.7. However, when the hafnium composition x is below 0.5, the effect of the leakage current can be produced, but the relative dielectric constant is lower for the large $Al_2O_3$ composition. To obtain high dielectric constant, it is preferable to form a film having a higher $HfO_2$ composition.

Then, first means of the present invention is to form an insulating film between the $Hf_xAl_{1-x}O_y$ film and the polycrystalline silicon film, which can suppress the abnormal growth of the polycrystalline silicon film. The abnormal growth of the polycrystalline silicon is due to forming the polycrystalline silicon film directly on the $Hf_xAl_{1-x}O_y$ film of the above-described composition. Accordingly, the abnormal growth of the polycrystalline silicon film can be suppressed by interposing an insulating film, such as silicon oxide film, silicon nitride film, silicon oxynitride film, $Al_2O_3$ (alumina) film, film having a $HfO_2$ composition x of below 0.7 including 0.7 ($0<x\leq0.7$) or others, which can suppress the abnormal growth of the polycrystalline silicon.

Figure 5:
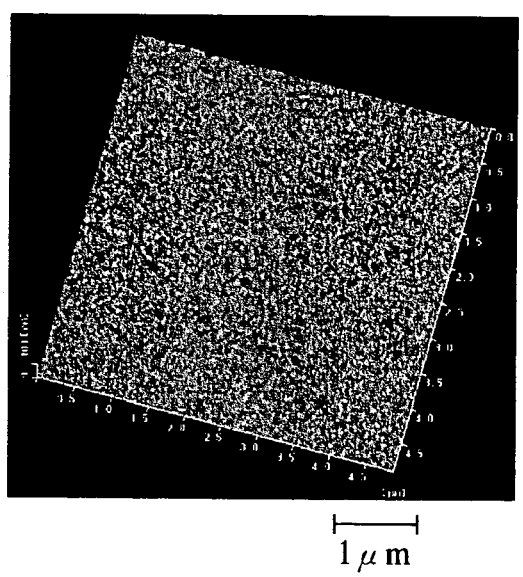
FIG. 5 is a topographic image of the surface state of the polycrystalline silicon film with the silicon nitride film formed between the $Hf_{0.8}Al_{0.2}O_y$ film and the polycrystalline silicon film.

FIG. 5 is a topographic image of a silicon nitride film formed between the $Hf_{0.8}Al_{0.2}O_y$ film and the polycrystalline silicon film. As evident in the comparison between FIG. 3C and FIG. 5, the silicon nitride film is interposed, whereby the local abnormal growth of the polycrystalline silicon can be suppressed.

In FIG. 4, the ▽ marks indicate the relationship between the number and the height of the precipitations when the silicon nitride film is formed between the $Hf_{0.8}Al_{0.2}O_y$ film and the polycrystalline silicon film. It is evident also from the graph of FIG. 4 that the formation of the silicon nitride film can suppress the abnormal growth of the polycrystalline silicon.

Figure 6:
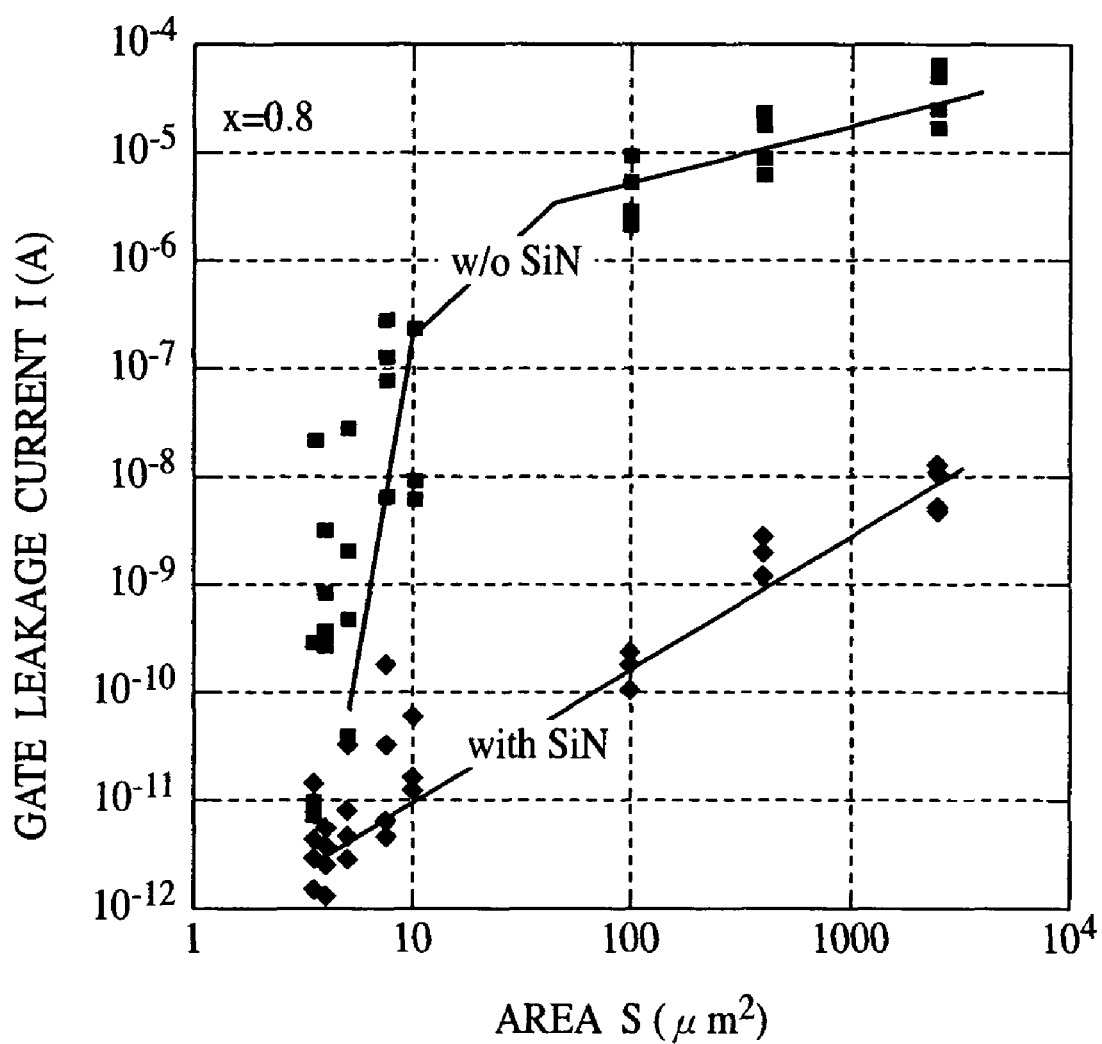
FIG. 6 is a graph showing gate area dependency of the gate leakage current with a silicon nitride film formed between the $Hf_{0.8}Al_{0.2}O_y$ film and the polycrystalline silicon film.

FIG. 6 is a graph of the gate area dependency of the gate leakage current in the case that the silicon nitride film is formed between the $Hf_{0.8}Al_{0.2}O_y$ film and the polycrystalline silicon film. As shown, the presence of the silicon nitride film can more decrease the leakage current and makes variations of the leakage current small in comparison with the leakage current in the case that the silicon nitride film is not formed.

In second means of the present invention, the film thickness of $Hf_xAl_{1-x}O_y$ is set to be below 1 nm. When the film thickness of $Hf_xAl_{1-x}O_y$ is below 1 nm, even with the hafnium composition x being $0.7<x<1$, the abnormal growth of the polycrystalline silicon can be suppressed. In this case, however, it is preferable to form the gate insulating film of a stacked film of other insulating films so as to ensure a sufficient physical film thickness as the gate insulating film.

Figure 7A:
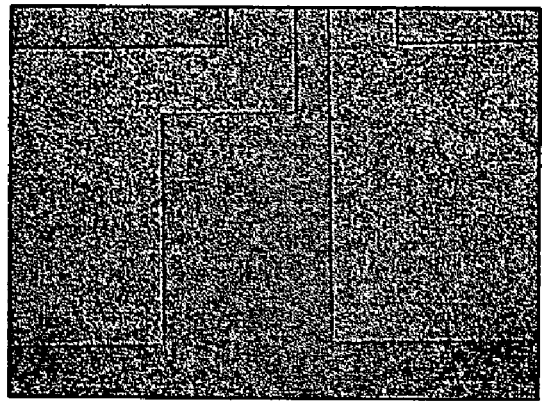
FIGS. 7A-7C are topographic images of surface states of the polycrystalline silicon films, which change with the film thickness of the $Hf_{0.8}Al_{0.2}O_y$ film changed.
Figure 7B:
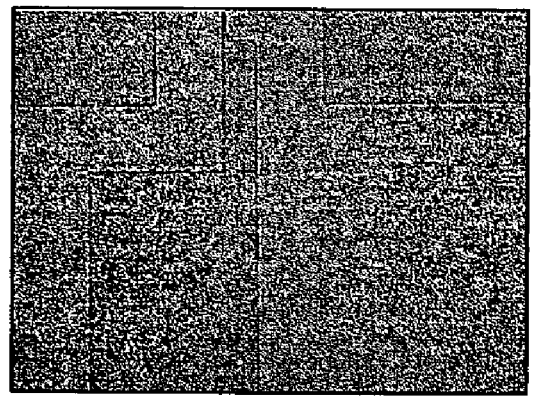
Figure 7C:
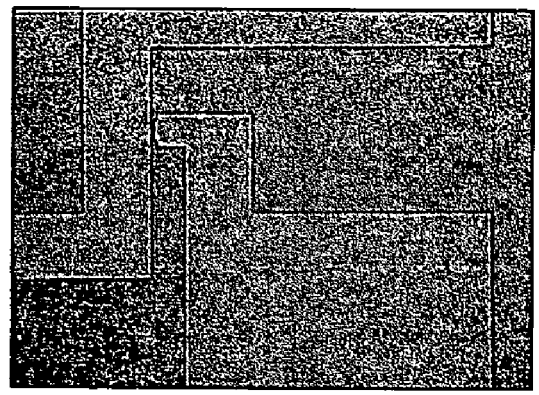

FIGS. 7A-7C are views of surface states of the $Hf_{0.8}Al_{0.2}O_y$ films with different film thicknesses. FIG. 7A shows the surface state of the $Hf_{0.8}Al_{0.2}O_y$ film of a 2 nm-thick. FIG. 7B is the surface state of the $Hf_{0.8}Al_{0.2}O_y$ film of a 1 nm-thick. FIG. 7C is the surface state of the $Hf_{0.8}Al_{0.2}O_y$ film of a 0.5 nm-thick.

As shown, when the film thickness is below 1 nm, the island-shaped projections produced by the abnormal growth of the polycrystalline silicon can be much suppressed.

In third means of the present invention, amorphous silicon is deposited in place of depositing polycrystalline silicon on $Hf_xAl_{1-x}O_y$. The earnest studies of the inventors of the present invention has found that when the film forming temperature is lowered to the film forming temperature of the amorphous silicon, the size of the island-shaped projections produced by the abnormal growth become smaller. Thus, amorphous silicon film is deposited in place of polycrystalline silicon film, whereby the abnormal growth can be suppressed.

Figure 8:
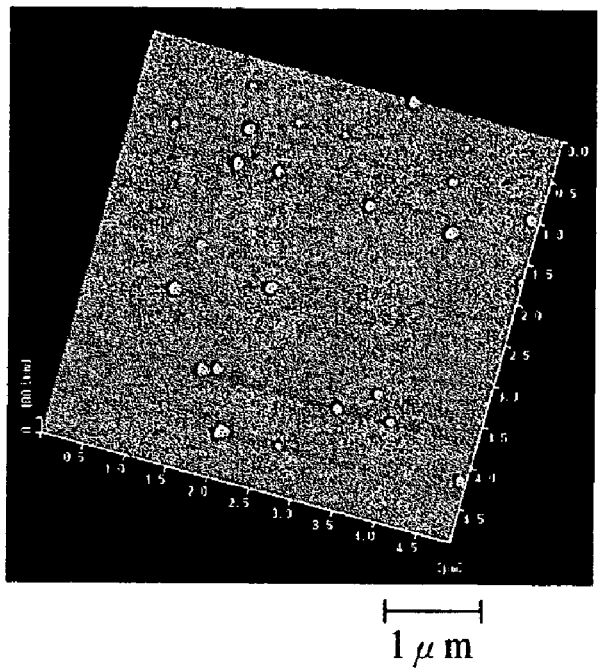
FIG. 8 is a topographic image of the surface state of the amorphous silicon deposited on the $Hf_{0.8}Al_{0.2}O_y$.

FIG. 8 is a topographic view of amorphous silicon deposited on the $Hf_{0.8}Al_{0.2}O_y$ at 550° C. As evident from the comparison between FIG. 3C and FIG. 8, the film forming temperature is made low, whereby sizes of the island-shaped projections can be made small.

The x marks in FIG. 4 indicate the number and height of depositions when amorphous silicon film is deposited on the $Hf_xAl_{1-x}O_y$ film. It is evident from FIG. 4 that the amorphous silicon film is deposited to thereby make the island-shaped projections small.

$Hf_xAl_{1-x}O_y$ is correctly expressed by $(HfO_2)_x(Al_2O_3)$. However, the respective oxidized states of the Hf and Al are not specifically defined, and the oxygen composition y varies depending on the hafnium composition x.

A First Embodiment

The semiconductor device and the method for fabricating the same according to a first embodiment of the present invention will be explained with reference to FIGS. 9 to 11C.

Figure 9:
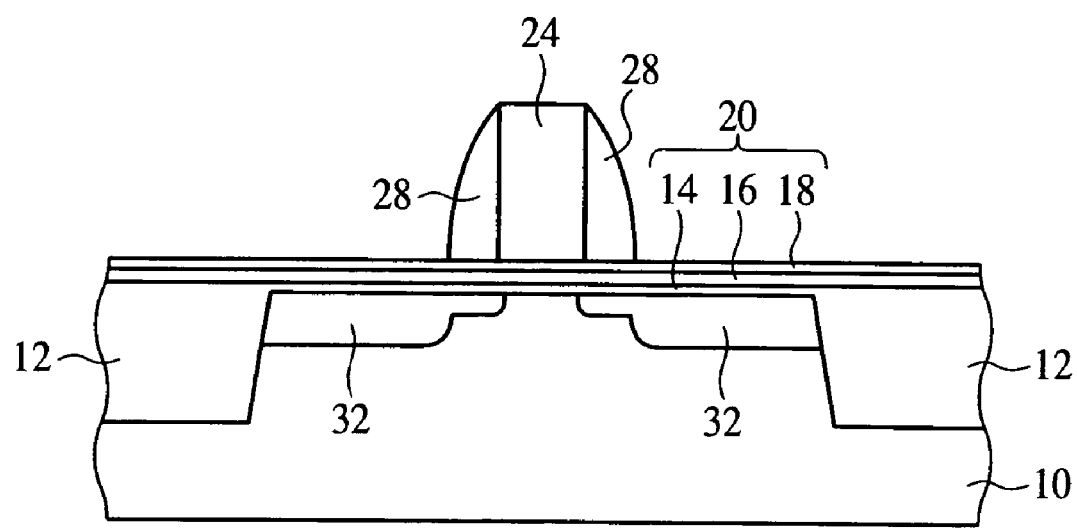
FIG. 9 is a diagrammatic sectional view of the semiconductor device according to a first embodiment of the present invention, which shows a structure thereof.

FIG. 9 is a sectional view of the semiconductor device according to the present embodiment, which shows a structure thereof. FIGS. 10A-10D and 11A-11C are sectional views of the semiconductor device according to the present embodiment in the steps of the method for fabricating the same, which show the method.

First, the structure of the semiconductor device according to the present embodiment will be explained with reference to FIG. 9.

A device isolation film 12 is formed on a silicon substrate 10. A gate insulating film 20 including an interfacial layer 14, an $Hf_{0.8}Al_{0.2}O_y$ film 16 and an $Al_2O_3$ (alumina) film 18 is formed on the silicon substrate in the device region defined by the device isolation film 12. A gate electrode 24 of a polycrystalline silicon film is formed on the gate insulating film 20. A sidewall insulating film 28 is formed on the sidewalls of the gate electrode 24. Source/drain diffused layers 32 are formed in the silicon substrate 10 on both sides of the gate electrode 24.

As described above, the semiconductor device according to the present embodiment is characterized mainly in that the gate insulating film 20 includes the $Al_2O_3$ film 18 formed on the $Hf_{0.8}Al_{0.2}O_y$ film 16. As described above, the $Hf_xAl_{1-x}O_y$ film having the hafnium composition x of $0.7 < x < 1$ is deposited directly on the polycrystalline silicon film, the local abnormal growth of the polycrystalline silicon takes place, which results in increase of the gate leakage current. As in the semiconductor device according to the present embodiment, the $Al_2O_3$ film 18 is formed on the $Hf_{0.8}Al_{0.2}O_y$ film 16, and the polycrystalline silicon film is deposited on the $Al_2O_3$ film 18, whereby the abnormal growth of the polycrystalline silicon can be prevented. Accordingly, the semiconductor device according to the present embodiment can decrease the gate leakage current.

Next, the method for fabricating the semiconductor device according to the present embodiment will be explained with reference to FIGS. 10A to 11C.

Figure 10A:
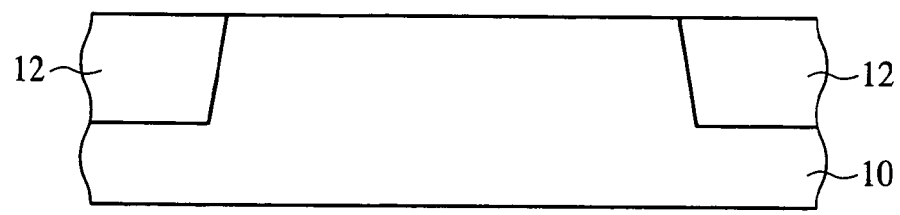
FIGS. 10A-10D and 11A-11C are sectional views of the semiconductor device according to the first embodiment of the present invention in the steps of the method for fabricating the same, which show the method.

First, a device isolation film 12 is formed on the silicon substrate 10 by, e.g., STI (Shallow Trench Isolation) method (FIG. 10A).

Next, the $Hf_{0.8}Al_{0.2}O_y$ film 16 of a 3 nm-thick is deposited by MOCVD method on the silicon substrate 10 with the device isolation film 12 formed on. The $Hf_{0.8}Al_{0.2}O_y$ film 16 is formed by, e.g., by using TTBAl (tri-tertiary butyl Al) as the Al raw material, TTBHf (tetra butoxy Hf) as the Hf raw material, $O_2$ gas as the oxidation gas and $N_2$ gas as the carrier gas, at a 500° C. substrate temperature, a 300 sccm TTBAl flow rate, a 35 sccm TTBHf flow rate, a 100 sccm $O_2$ flow rate and a 1500 sccm total flow rate.

When the $Hf_{0.8}Al_{0.2}O_y$ film 16 is formed, an interfacial layer 14 is formed between the silicon substrate 10 and the $Hf_{0.8}Al_{0.2}O_y$ film 16. The interfacial layer will be formed by the silicon substrate 10 being oxidized in forming the $Hf_{0.8}Al_{0.2}O_y$ film 16.

Figure 10B:
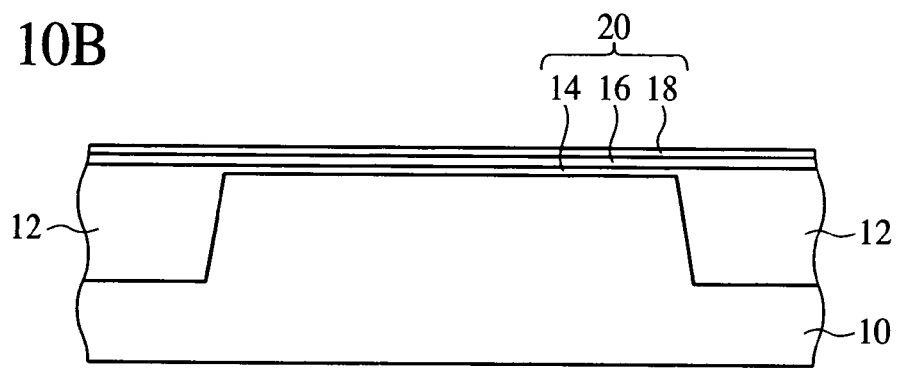

Next, the $Al_2O_3$ film 18 of, e.g., a 1 nm-thick is formed on the $Hf_{0.8}Al_{0.2}O_y$ film 16 (FIG. 10B). The $Al_2O_3$ film 18 is formed by, e.g., using TTBAl as the Al raw material, $O_2$ gas as the oxidizing gas and $N_2$ gas as the carrier gas, and at a 500° C. substrate temperature, a 300 sccm TTBAl flow rate, a 100 sccm $O_2$ flow rate and a 1500 sccm total flow rate.

It is preferable that the $Hf_{0.8}Al_{0.2}O_y$ film 16 is continuously formed in the same film forming chamber as the $Hf_{0.8}Al_{0.2}O_y$ film 16 has been deposited. The $Al_2O_3$ film 18 can be deposited by stopping the supply a hafnium source used in depositing the $Hf_{0.8}Al_{0.2}O_y$ film 16. This prevents the $Hf_{0.8}Al_{0.2}O_y$ film 16 from being exposed to the ambient atmosphere, and the interface can have good quality.

Thus, the gate insulating film 20 of the stacked film of the $Hf_{0.8}Al_{0.2}O_y$ film 16 and the $Al_2O_3$ film 18 can be formed on the silicon substrate 10.

Figure 10C:
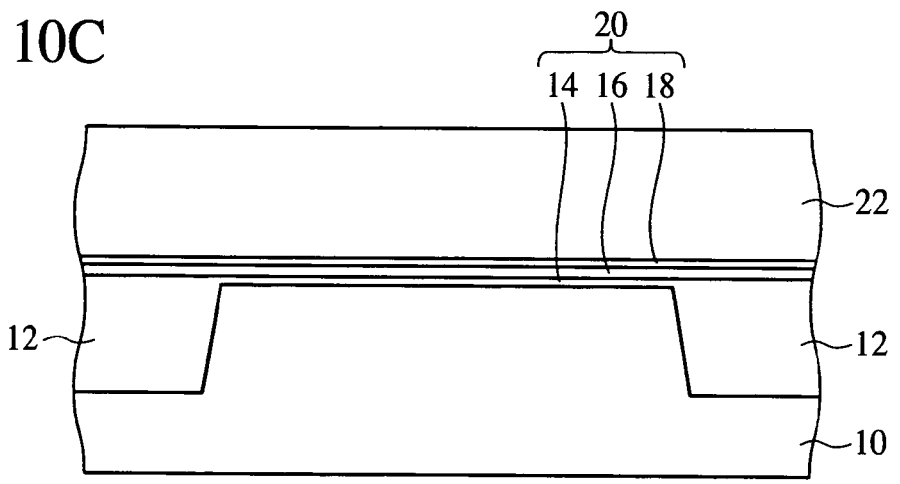

Next, the polycrystalline silicon film 22 of, e.g., a 150 nm-thick is formed on the gate insulating film 20 by, e.g., low-pressure CVD method (FIG. 10C). The polycrystalline silicon film 22 is formed, e.g., by using $SiH_4$ (20%) and He (80%) as the raw materials, and at a 500 sccm total flow rate, a 30 Pa chamber pressure and a 620° C. film forming temperature.

The above-described conditions for forming the polycrystalline silicon film 22 produce the local abnormal growth when the polycrystalline silicon film is formed directly on the $Hf_{0.8}Al_{0.2}O_y$ film 16. In the present embodiment, however, because of the $Al_2O_3$ film 18 formed between the $Hf_{0.8}Al_{0.2}O_y$ film 16 and the polycrystalline silicon film 22, the local abnormal growth of the polycrystalline silicon film 22 does not take place.

Figure 10D:
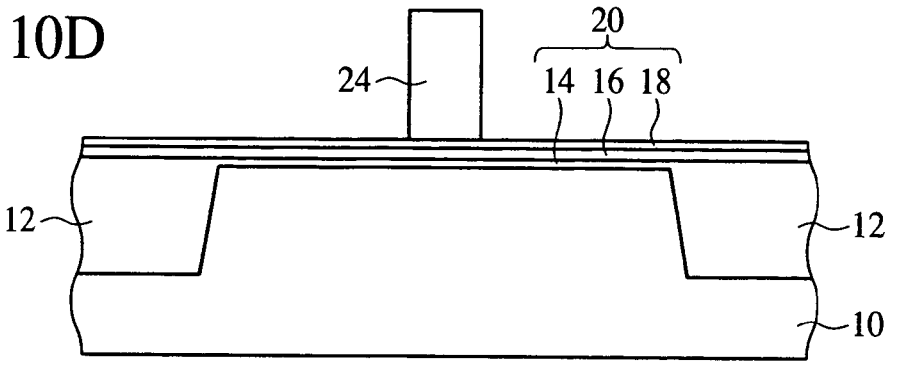

Then, the polycrystalline silicon film 22 is patterned by photolithography and dry etching to form the gate electrode 24 of the polycrystalline silicon film 22 (FIG. 10D).

Figure 11A:
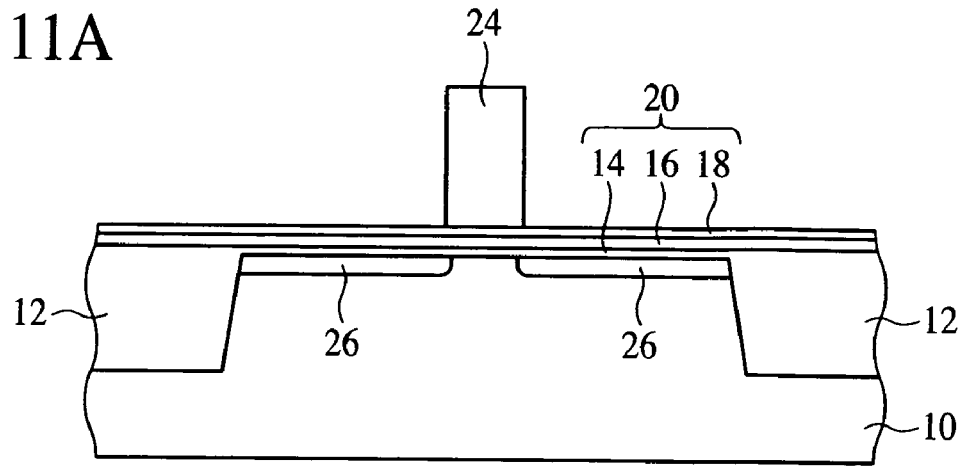

Next, with the gate electrode 24 as the mask, arsenic ions, for example, are implanted to form impurity diffused regions 26 to be LDD regions or extension regions in the silicon substrate 10 on both sides of the gate electrode 24 (FIG. 11A).

Figure 11B:
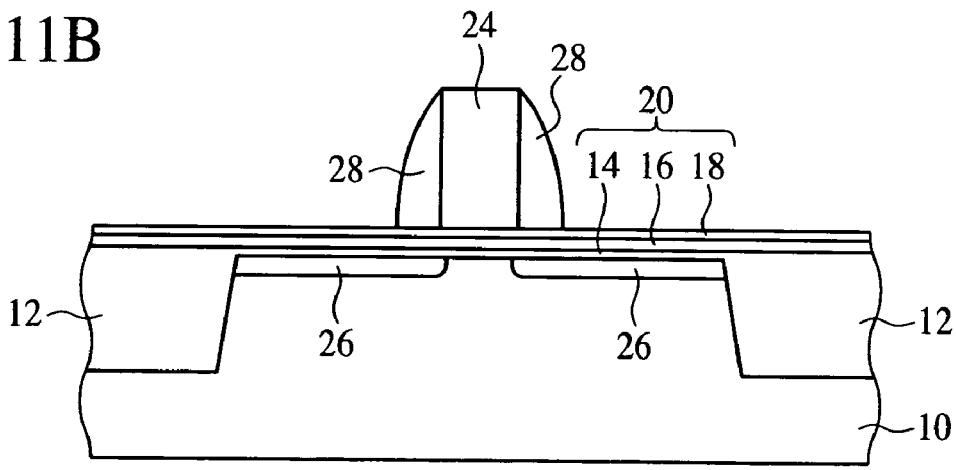
Figure 11C:
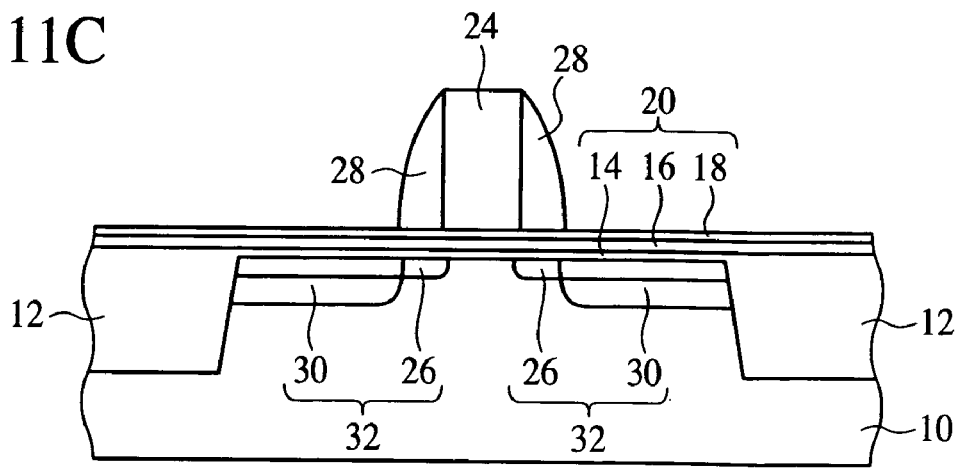

Then, a silicon nitride film of, e.g., a 110 nm-thick is deposited by, e.g., CVD method, and the silicon nitride film is etched back to form the sidewall insulating film 28 of the silicon nitride film on the side walls of the gate electrode 24 (FIG. 11B).

Next, with the gate electrode 24 and the sidewall insulating film 28 as the mask, arsenic ions, for example, are implanted to form impurity diffused regions 30 in the silicon substrate 10 on both sides of the gate electrode 24.

Then, the implanted impurities are activated by the rapid thermal processing of, e.g., 1500° C. and 1 second to form the source/drain diffused layer 32 of the impurity diffused regions 26, 30 (FIG. 1C).

Thus, the semiconductor device shown in FIG. 9 is fabricated.

As described above, according to the present embodiment, the $Al_2O_3$ film is formed between the $Hf_{0.8}Al_{0.2}O_y$ film and the polycrystalline silicon film, whereby the local abnormal growth of the polycrystalline silicon film in the process of forming the polycrystalline silicon film can be prevented. The gate leakage current can be much decreased.

A Second Embodiment

The semiconductor device and the method for fabricating the same according to a second embodiment of the present invention will be explained with reference to FIG. 12. The same members of the present embodiment as those of the semiconductor device and the method for fabricating the same according to the first embodiment shown in FIGS. 9 to 11C are represented by the same reference numbers not to repeat or to simplify their explanation.

Figure 12:
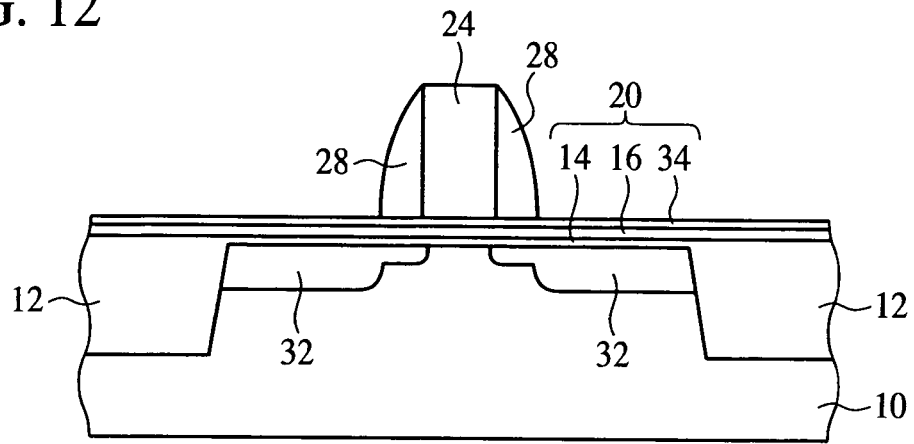
FIG. 12 is a diagrammatic sectional view of the semiconductor device according to a second embodiment of the present invention, which shows a structure thereof.

FIG. 12 is a diagrammatic sectional view of the semiconductor device according to the present embodiment, which shows a structure thereof.

The semiconductor device according to the present embodiment is the same in the basic structure as the semiconductor device according to the first embodiment shown in FIG. 9. The semiconductor device according to the present embodiment is different from the semiconductor device according to the first embodiment in that in the former, a silicon nitride film 34 is formed in place of the $Al_2O_3$ film 18.

The silicon nitride film 34 has the effect of preventing the local abnormal growth of polycrystalline silicon, as does the $Al_2O_3$ film 18. Accordingly, the silicon nitride film 34 is formed between the $Hf_{0.8}Al_{0.2}O_y$ film 16 and the gate electrode 24, whereby the abnormal growth of polycrystalline silicon can be prevented. Accordingly, the semiconductor device according to the present embodiment can decrease the gate leakage current.

Nitrogen-content silicon-based insulating films have the effect of suppressing the diffusion of boron. Accordingly, in p-channel transistors, the diffusion of boron from the gate electrode 24 to the silicon substrate 10 can be prevented, whereby degradation of the transistor characteristics due to the diffusion of boron can be prevented.

The semiconductor device according to the present embodiment can be fabricated by the method for fabricating the semiconductor device according to the first embodiment, in which the silicon nitride film 34 is formed in place of the $Al_2O_3$ film 18.

The silicon nitride film 34 can be formed by depositing a silicon nitride film of, e.g., a 0.5 nm-thick by, e.g., low-pressure CVD method. It is preferable that the silicon nitride film, whose relative dielectric constant is lower than alumina, is formed thinner than alumina film.

As described above, according to the present embodiment, the silicon nitride film is formed between the $Hf_{0.8}Al_{0.2}O_y$ film and the polycrystalline silicon film, whereby the local abnormal growth of the polycrystalline silicon film in the process of forming the polycrystalline silicon film can be prevented. The gate leakage current can be much decreased.

In the present embodiment, the silicon nitride film is formed on the $Hf_{0.8}Al_{0.2}O_y$ film, but SiON (silicon oxynitride) film may be formed in place of the silicon nitride film.

A Third Embodiment

The semiconductor device and the method for fabricating the same according to a third embodiment of the present invention will be explained with reference to FIG. 13. The same members of the present embodiment as those of the semiconductor device and the method for fabricating the same according to the first and the second embodiments shown in FIGS. 9 to 12 are represented by the same reference numbers not to repeat or to simplify their explanation.

Figure 13:
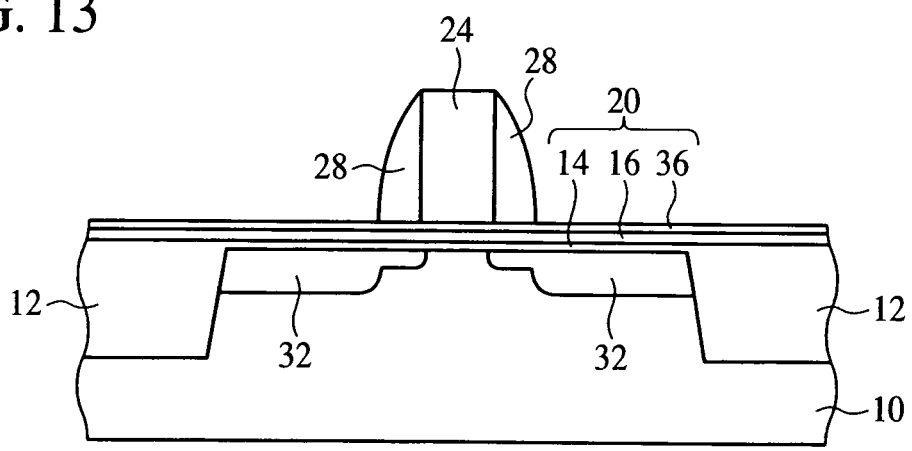
FIG. 13 is a diagrammatic sectional view of the semiconductor device according to a third embodiment of the present invention, which shows a structure thereof.

FIG. 13 is a diagrammatic sectional view of the semiconductor device according to the present embodiment, which shows a structure thereof.

The semiconductor device according to the present embodiment is the same in the basic structure as the semiconductor device according to the first embodiment shown in FIG. 9. The semiconductor device according to the present embodiment is different from the semiconductor device according to the first embodiment in that in the former an $Hf_{0.5}Al_{0.5}O_y$ film 36 is formed in place of the $Al_2O_3$ film 18.

When $Hf_xAl_{1-x}O_y$ has a hafnium composition x of below 0.7, as described above, the local abnormal growth does not take place even when the polycrystalline silicon is deposited directly on the $Hf_xAl_{1-x}O_y$ film. Accordingly, the hafnium composition of at least the uppermost part of the $Hf_xAl_{1-x}O_y$, which contacts the polycrystalline silicon has the hafnium composition x of below 0.7, whereby the abnormal growth of the polycrystalline silicon can be prevented. Accordingly, the semiconductor device according to the present embodiment can decrease the gate leakage current.

The semiconductor device according to the present embodiment can be fabricated by the method for fabricating the semiconductor device according to the first embodiment, in which the $Hf_{0.5}Al_{0.5}O_y$ film is formed in place of the $Al_2O_3$ 18. Specifically, the $Hf_{0.5}Al_{0.5}O_y$ film is formed, e.g., by using TTBAl as the Al raw material, TTBHf as the Hf raw material, $O_2$ gas as the oxidation gas and $N_2$ gas as the carrier gas, and at a 500° C. substrate temperature, a 500 sccm flow rate of the TTBHf, a 140 sccm flow rate of the TTBAl, a 100 sccm flow rate of $O_2$ and a 1500 sccm total flow rate. Thus, the $Hf_{0.5}Al_{0.5}O_y$ film 36 can be formed. The film thickness of the $Hf_{0.5}Al_{0.5}O_y$ film 36 is set to, e.g., 1 nm.

The $Hf_{0.5}Al_{0.5}O_y$ film, whose relative dielectric constant is higher than the relative dielectric constants of $Al_2O_3$ and silicon nitride film, advantageously allows the physical film thickness of the gate insulating film 20 larger than the gage insulating film of the semiconductor device according to the first and the second embodiments. To obtain the relative dielectric constant higher, it is preferable to approximate the hafnium composition x to 0.7 which is upper limit.

As described above, according to the present embodiment, the $Hf_xAl_{1-x}O_y$ film having a below 0.7 hafnium composition x is formed between the $Hf_xAl_{1-x}O_y$ film and the polycrystalline silicon film, whereby the local abnormal growth of the polycrystalline silicon can be prevented. The presence of the material whose relative dielectric constant is higher than the relative dielectric constants of the semiconductor device according to the first and the second embodiments allows the gate insulating film to have a larger physical film thickness. Accordingly, the gate leakage current can be much decreased.

In the present embodiment, the $Hf_{0.5}Al_{0.5}O_y$ film 36 is formed on the $Hf_{0.8}Al_{0.2}O_y$ film 16. However, the hafnium composition x of the $Hf_xAl_{1-x}O_y$ at least at the uppermost part which contacts the polycrystalline silicon is below 0.7, whereby the abnormal growth of the polycrystalline silicon can be prevented. Accordingly, the hafnium composition of the $Hf_{0.5}Al_{0.5}O_y$ film 36 is not limited to this composition. The hafnium composition is not essentially changed in a step, and the $Hf_xAl_{1-x}O_y$ film can be a composition graded layer whose hafnium composition is gradually decreased to a below 0.7 hafnium composition x at the surface.

A Fourth Embodiment

The semiconductor device and the method for fabricating the same according to a fourth embodiment of the present invention will be explained with reference to FIGS. 14 and 15A-15C. The same members of the present embodiment as those of the semiconductor device and the method for fabricating the same according to the first to the third embodiments shown in FIGS. 9 to 13 are represented by the same reference numbers not to repeat or to simplify their explanation.

Figure 14:
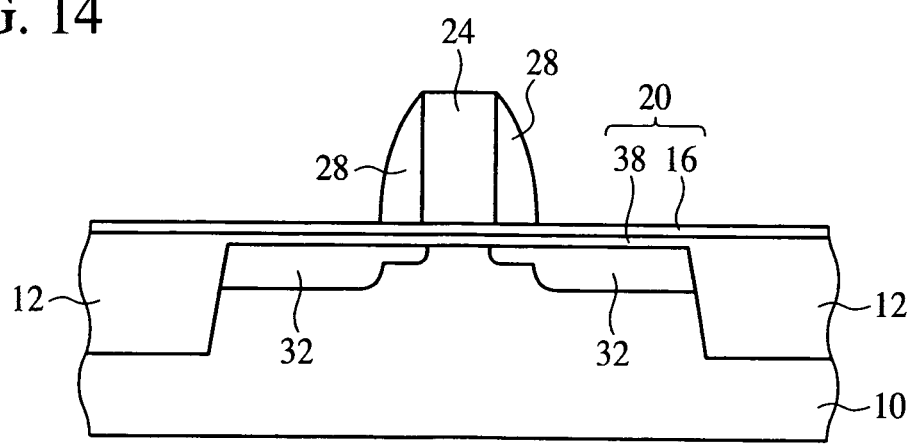
FIG. 14 is a diagrammatic sectional view of the semiconductor device according to a fourth embodiment of the present invention, which shows a structure thereof.
Figure 15A:
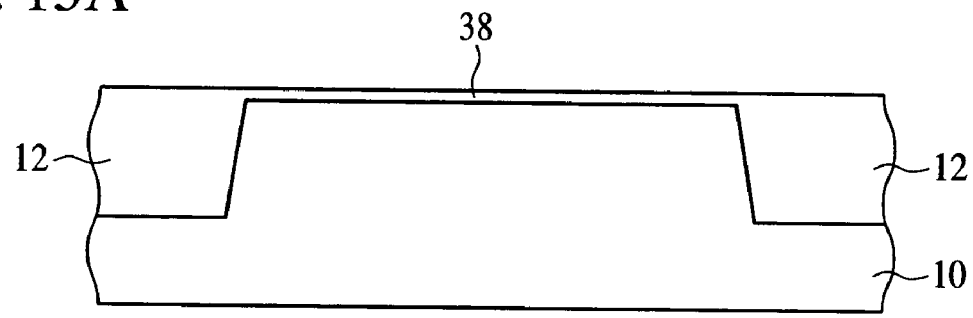
FIGS. 15A-15C are sectional views of the semiconductor device according to the fourth embodiment of the present invention in the steps of the method for fabricating the same, which show the method.
Figure 15B:
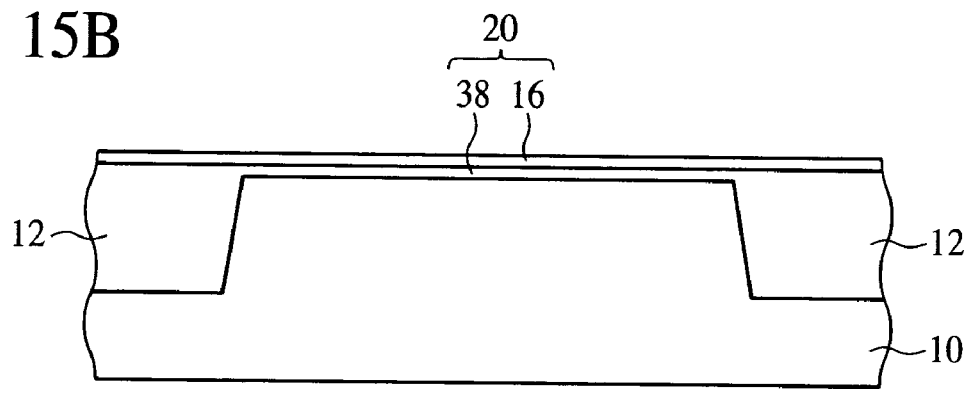
Figure 15C:
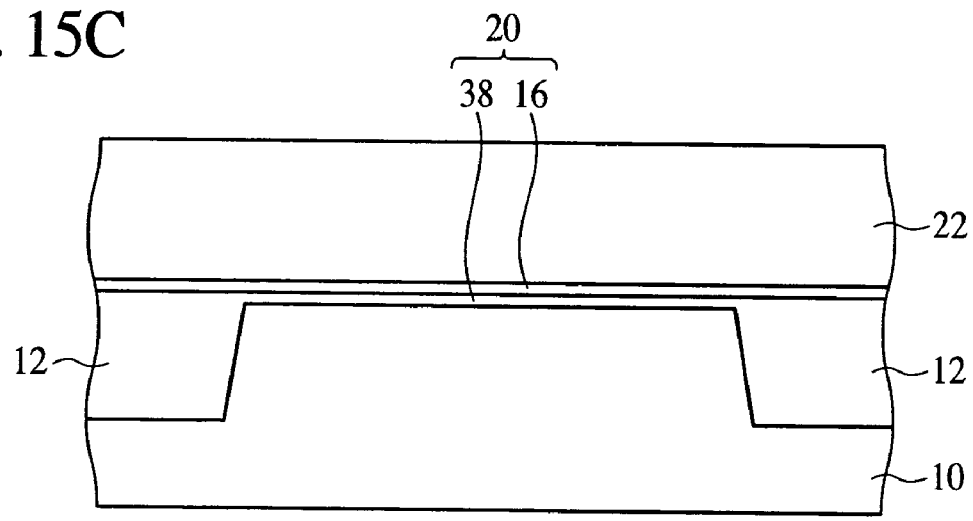

FIG. 14 is a diagrammatic sectional view of the semiconductor device according to the present embodiment, which shows a structure thereof. FIGS. 15A-15C are sectional views of the semiconductor device according to the present embodiment in the steps of the method for fabricating the same, which show the method.

First, the structure of the semiconductor device according to the present embodiment will be explained with reference to FIG. 14.

A device isolation film 12 is formed on a silicon substrate 10. A gate insulating film 20 of a 1 nm-thick SiON film 38 and a 1 nm-thick $Hf_{0.8}Al_{0.2}O_y$ film 16 is formed on a silicon substrate 10 in the device region defined by the device isolation film 12. A gate electrode 24 of a polycrystalline silicon film is formed on the gate insulating film 20. A side wall insulating film 28 is formed on the side walls of the gate electrode 24. Source/drain diffused layers 32 are formed in the silicon substrate 10 on both sides of the gate electrode 24.

As described above, the semiconductor device according to the present embodiment is characterized mainly in that the gate insulating film 20 is formed of a 1 nm-thick SiON film 38 and a 1 nm-thick $Hf_{0.8}Al_{0.2}O_y$ film 16. As described above, the film thickness of the $Hf_xAl_{1-x}O_y$ is set to be below 1 nm, whereby the local abnormal growth of the polycrystalline silicon can be suppressed. The SiON film 38 is formed below the $Hf_{0.8}Al_{0.2}O_y$ film 16 so as to increase the physical film thickness of the gate insulating film 20. Thus, the semiconductor device according to the present embodiment can decrease the gate leakage current. In a p-channel transistor including the gate electrode 24 doped with boron, the use of the insulating film of nitrogen-content silicon oxide can prevent the diffusion of boron from the gate electrode 24 to the silicon substrate 10. Accordingly, degradation of the transistor characteristics due to the diffusion of boron can be prevented.

Next, the method for fabricating the semiconductor device according to the present embodiment will be explained with reference to FIGS. 15A-15C.

First, the device isolation film 12 for defining the device region is formed on the silicon substrate 10 by, e.g., STI method.

Next, the SiON film 38 of, e.g., a 1 nm-thick is formed by thermal oxidation on the silicon substrate 10 with the device isolation film 12 formed on (FIG. 15A).

Then, the $Hf_{0.8}Al_{0.2}O_y$ film 16 of a 1 nm-thick is deposited on the SiON film 38 by, e.g., MOCVD method (FIG. 15B).

Next, the polycrystalline silicon film 22 of, e.g., a 150 nm-thick is formed on the gate insulating film 20 by, e.g., low-pressure CVD method (FIG. 15C).

The above-described conditions for forming the polycrystalline silicon film 22 produce the local abnormal growth when the polycrystalline silicon film is deposited directly on the $Hf_{0.8}Al_{0.2}O_y$ film 16. In the present embodiment, however, the film thickness of the $Hf_{0.8}Al_{0.2}O_y$ film 16 is 1 nm, which suppresses the local abnormal growth of the polycrystalline silicon film 22.

Then, in the same way as in, e.g., the method for fabricating the semiconductor device according to the first embodiment shown in FIGS. 10D to 11C, the gate electrode 24, the source/drain diffused layers 32, etc. are formed.

As described above, according to the present embodiment, the film thickness of the $Hf_xAl_{1-x}O_y$ is below 1 nm, whereby the local abnormal growth of the polycrystalline silicon can be suppressed. The SiON film is formed below the $Hf_xAl_{1-x}O_y$ film, whereby the physical film thickness of the gate insulating film is allowed to be increased, and in a p-channel transistor, the diffusion of boron from the gate electrode to the substrate can be prevented. Thus, the semiconductor device according to the present embodiment can decrease the gate leakage current.

A Fifth Embodiment

The semiconductor device and the method for fabricating the same according to a fifth embodiment of the present invention will be explained with reference to FIGS. 16 and 17A-17C. The same members of the present embodiment as those of the semiconductor device and the method for fabricating the same according to the first to the fourth embodiments shown in FIGS. 9 to 15C are represented by the same reference numbers not to repeat or to simplify their explanation.

Figure 16:
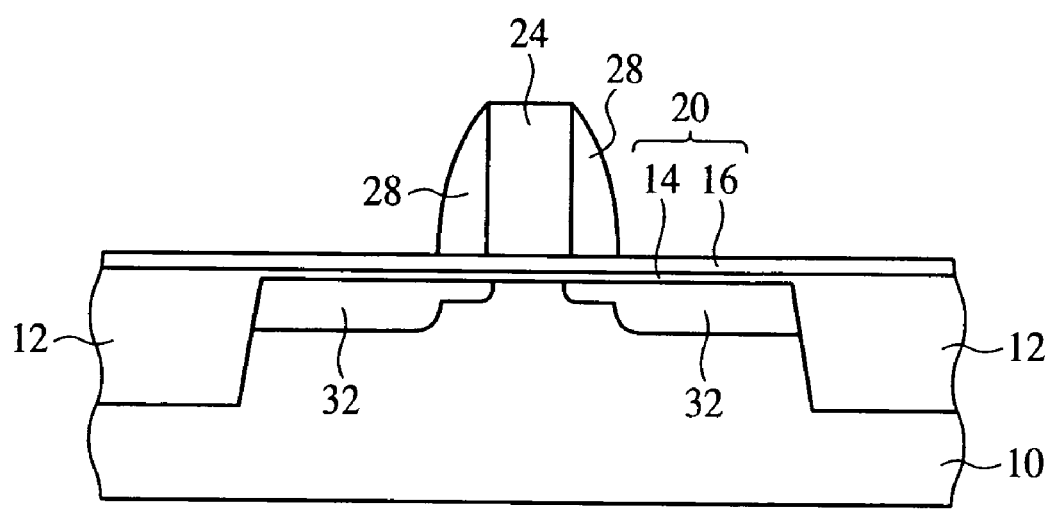
FIG. 16 is a diagrammatic sectional view of the semiconductor device according to a fifth embodiment of the present invention, which shows a structure thereof.
Figure 17A:
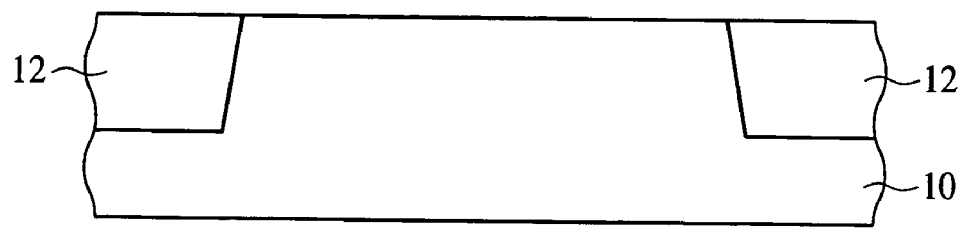
FIGS. 17A-17C are sectional views of the semiconductor device according to the fifth embodiment of the present invention in the steps of the method for fabricating the same, which show the method.
Figure 17B:
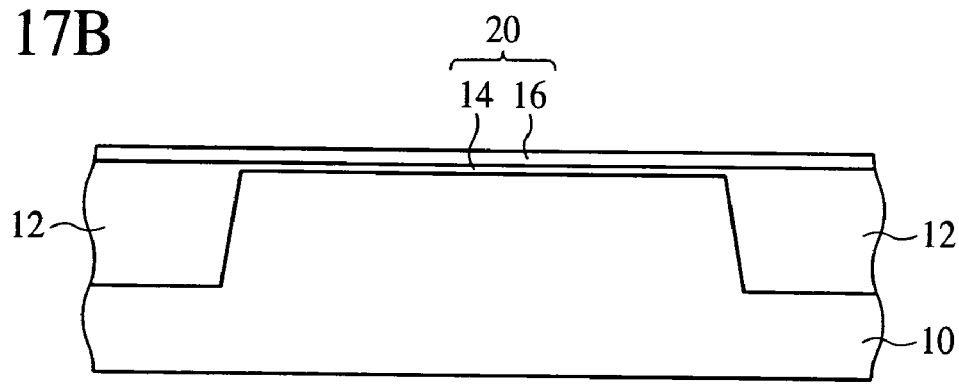
Figure 17C:
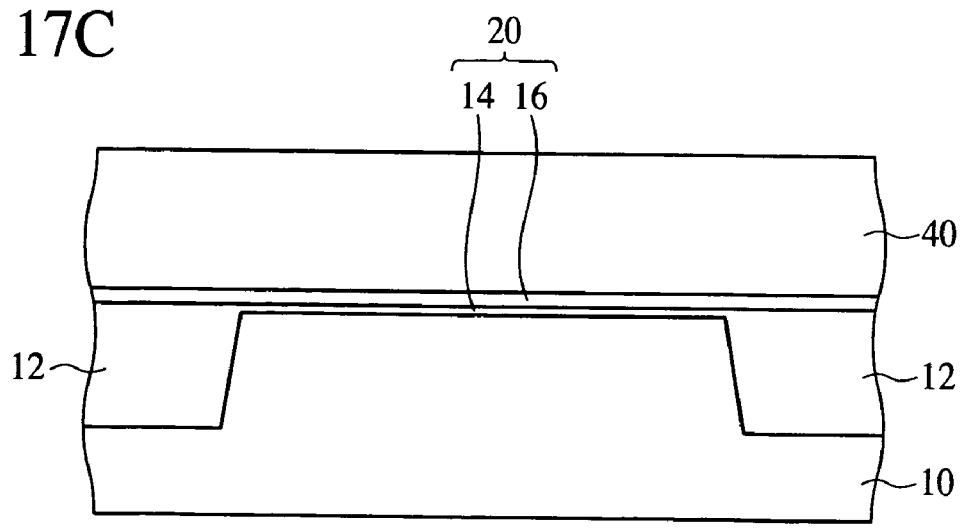

FIG. 16 is a diagrammatic sectional view of the semiconductor device according to the present embodiment, which shows a structure thereof. FIGS. 17A-17C are sectional views of the semiconductor device according to the present embodiment in the steps of the method for fabricating the same, which show the method.

First, the structure of the semiconductor device according to the present embodiment will be explained with reference to FIG. 16.

A device isolation film 12 is formed on a silicon substrate 10. A gate insulating film 20 including an interfacial layer 14 and an $Hf_{0.8}Al_{0.2}O_y$ film 16 is formed on the silicon substrate 10 in a device region defined by the device isolation film 12. A gate electrode 24 of a polycrystalline silicon film is formed on the gate insulating film 20. A sidewall insulating film 28 is formed on the side walls of the gate electrode 24. Source/drain diffused layers 32 are formed in the silicon substrate 10 on both sides of the gate electrode 24.

Next, the method for fabricating the semiconductor device according to the present embodiment will be explained with reference to FIG. 17.

First, the device isolation film 12 for defining the device region is formed on the silicon substrate 10 by, e.g., STI method (FIG. 17A).

Then, the $Hf_{0.8}Al_{0.2}O_y$ film 16 of a 3 nm-thick is formed by MOCVD method on the silicon substrate 10 with the device isolation film 12 formed on (FIG. 17B).

When the $Hf_{0.8}Al_{0.2}O_y$ film 16 is formed, the interfacial layer 14 is formed in the interface between the silicon substrate 10 and the $Hf_{0.8}Al_{0.2}O_y$ film 16.

Next, an amorphous silicon film 40 of, e.g., a 150 nm-thick is formed on the gate insulating film 20 by, e.g., low-pressure CVD method (FIG. 17C). The amorphous silicon film 40 is formed, e.g., by using $SiH_4$ (20%) and He (80%) as the raw materials at a 500 sccm total flow rate, a 30 Pa chamber pressure and a 550° C. film forming temperature. Decreasing the film forming temperature to 550° C. or below allows the amorphous silicon film to be deposited under the same film forming conditions as the polycrystalline silicon film.

Decreasing the temperature for forming the film forming the gate electrode to the temperature for forming the amorphous silicon can suppress the local abnormal growth in the process of forming the film.

Then, in the same way as in, e.g., the method for fabricating the semiconductor device according to the first embodiment shown in FIGS. 10D to 11D, the gate electrode 24, the source/drain diffused layers 32, etc. are formed.

The amorphous silicon film 40 is crystallized into polycrystalline silicon when the impurities are activated by thermal processing. However, no island-shaped projections are abnormally grown in the thermal processing.

As described above, according to the present embodiment, amorphous silicon is deposited on $Hf_xAl_{1-x}O_y$, whereby the abnormal growth of the island-shaped projections can be prevented in the film forming process and the following crystallization thermal processing.

[Modifications]

The present invention is not limited to the above-described embodiments and can cover other various modifications.

For example, in the first to the third embodiments described above, the nitrogen-content silicon-based insulating film, the alumina film or the $Hf_xAl_{1-x}O_y$ film of a hafnium composition x=0.7 are formed on an $Hf_xAl_{1-x}O_y$ film, but any dielectric film can be used as long as the dielectric film is capable of suppressing the abnormal growth of the polycrystalline silicon film. The dielectric film on the $Hf_xAl_{1-x}O_y$ film of a hafnium composition x of 0.7<x<1 is not essentially 1 layer, and 2 or more layers can be formed.

In the fourth embodiment, the SiON film is formed between the silicon substrate and the $Hf_xAl_{1-x}O_y$ film, but in place of the SiON film, another dielectric film may be formed. For example, a silicon oxide film or a silicon nitride film can be used in place of the SiON film. From the viewpoint of preventing the diffusion of boron from the polycrystalline silicon film to the substrate, it is preferable to use nitrogen-content silicon-based insulating film.

In the first to the fifth embodiments, the present invention is applied to semiconductor devices having the gate electrodes formed of polycrystalline silicon film, but the structures of the gate electrodes are not limited to the above. For example, the present invention is applicable to semiconductor devices of the polycide gate structure of the stacked film of a polycrystalline silicon film and a silicide film or the polymetal gate structure of the stacked film of a polycrystalline silicon film and a metal film.

The present invention is applicable to the semiconductor devices including gate electrodes formed by forming dummy gate electrodes of polycrystalline silicon film on the gate insulating film and replacing the dummy gate electrodes by metal materials such as aluminum or others.

In the above-described embodiments, the present invention is applied to n-channel MIS transistors but is applicable to p-channel MIS transistors.

What is claimed is:

1. A semiconductor device comprising:
a gate insulating film including a first dielectric film of $Hf_xAl_{1-x}O_y$ in which x is $0.7<x<1$, formed over a semiconductor substrate, and a second dielectric film of a nitrogen-content silicon-based insulating film, an alumina film or an $Hf_xAl_{1-x}O_y$ film in which X is $0<x<0.7$ formed over the first dielectric film; and
a gate electrode formed on the gate insulating film and including a polycrystalline silicon film.

2. A semiconductor device comprising:
a gate insulating film formed on a semiconductor substrate and including an $Hf_xAl_{1-x}O_y$ film having a thickness below 1 nm in which x is $0.7<x<1$; and
a gate electrode formed on the gate insulating film and including a polycrystalline silicon film.

3. A semiconductor device according to claim 2, wherein the gate insulating film further including a nitrogen-content silicon-based insulating film formed between the semiconductor substrate and the $Hf_xAl_{1-x}O_y$ film.

4. A semiconductor device according to claim 3, wherein the nitrogen-content silicon-based insulating film is a silicon nitride film or a silicon oxynitride film.

* * * * *